United States Patent
Hefner, Jr. et al.

(10) Patent No.: US 9,382,472 B2
(45) Date of Patent: Jul. 5, 2016

(54) TRANSFORMATIVE WAVELENGTH CONVERSION MEDIUM

(71) Applicants: Rohm and Haas Electronic Materials LLC, Marlborough, MA (US); Dow Global Technologies LLC, Midland, MI (US)

(72) Inventors: Robert E. Hefner, Jr., Rosharon, TX (US); Kishori Deshpande, Lake Jackson, TX (US); Maurice J. Marks, Lake Jackson, TX (US); Peter Trefonas, Medway, MA (US); Jong Keun Park, Westborough, MA (US); Jieqian Zhang, Southborough, MA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 8 days.

(21) Appl. No.: 14/550,216

(22) Filed: Nov. 21, 2014

(65) Prior Publication Data

US 2015/0166884 A1    Jun. 18, 2015

Related U.S. Application Data

(60) Provisional application No. 61/917,653, filed on Dec. 18, 2013.

(51) Int. Cl.

| | |
|---|---|
| *H05B 33/04* | (2006.01) |
| *C08K 3/00* | (2006.01) |
| *C08K 3/14* | (2006.01) |
| *C08L 63/00* | (2006.01) |
| *C09D 163/00* | (2006.01) |
| *C09K 11/08* | (2006.01) |
| *C09K 11/65* | (2006.01) |
| *C09K 11/02* | (2006.01) |
| *C09K 11/77* | (2006.01) |
| *H01L 33/50* | (2010.01) |

(52) U.S. Cl.
CPC ........... *C09K 11/025* (2013.01); *C09K 11/7728* (2013.01); *H01L 33/502* (2013.01)

(58) Field of Classification Search
None
See application file for complete search history.

(56) References Cited

U.S. PATENT DOCUMENTS

| | | | |
|---|---|---|---|
| 8,167,674 B2 | 5/2012 | Hussell et al. | |
| 8,318,834 B2 | 11/2012 | Hefner, Jr. et al. | |
| 8,455,898 B2 | 6/2013 | Anc | |
| 2003/0135059 A1 | 7/2003 | Matsumura et al. | |
| 2008/0173886 A1 | 7/2008 | Cheon et al. | |
| 2011/0039982 A1 | 2/2011 | Hefner, Jr. et al. | |
| 2011/0279016 A1* | 11/2011 | Li | C04B 35/58 313/503 |
| 2013/0005853 A1 | 1/2013 | Morley et al. | |
| 2013/0065986 A1* | 3/2013 | Sato | C08G 59/226 523/427 |
| 2013/0178590 A1 | 7/2013 | Jin et al. | |
| 2013/0241086 A1 | 9/2013 | Sakane | |
| 2013/0241088 A1 | 9/2013 | Onai | |
| 2013/0256863 A1 | 10/2013 | Ito | |

FOREIGN PATENT DOCUMENTS

| | | | | |
|---|---|---|---|---|
| JP | 2008-163259 A | * | 7/2008 | ............. C09K 11/65 |
| WO | WO 2012/020625 A1 | * | 2/2012 | ............. C08G 59/20 |

OTHER PUBLICATIONS

Machine translation of JP 2008-163259 A, provided by the JPO website (no date).*
Daciel Corporation Products List: EHPE3150 (no date). http://www.daicel.com/yuuki/en/product/index.php?page=1&act=detail&cid=30&id=227.*
Cas.Chemnet.com: 244772-00-7 (no date).*
Copending U.S. Appl. No. 14/550,265.
Zhao, et al., High-Temperature Luminescene Quenching of Colloidal Quantum Dots, ACSNANO, vol. 6, No. 10, pp. 9058-9067 (2012).

* cited by examiner

Primary Examiner — Michael J Feely
(74) Attorney, Agent, or Firm — Thomas S. Deibert

(57) ABSTRACT

A transformative wavelength conversion medium is provided, comprising: a phosphor; and, a curable liquid component, wherein the curable liquid component, comprises: an aliphatic resin component, wherein the aliphatic resin component has an average of at least two epoxide groups per molecule; and, a curing agent; wherein the curable liquid component contains less than 0.5 wt % of monoepoxide molecules (based on the total weight of the aliphatic resin component); wherein the curable liquid component contains 1 to 90 wt % of polyepoxide molecules containing at least three epoxide groups per molecule (based on the total weight of the aliphatic resin component); and, wherein the curable liquid component is a liquid at 25° C. and atmospheric pressure; wherein the phosphor is dispersed in the curable liquid component.

5 Claims, No Drawings

TRANSFORMATIVE WAVELENGTH CONVERSION MEDIUM

This application claims priority to U.S. Provisional Application No. 61/917,653 filed on Dec. 18, 2013

The present invention relates to a transformative wavelength conversion medium, comprising: a phosphor; and, a curable liquid component, wherein the curable liquid component, comprises: an aliphatic resin component, wherein the aliphatic resin component has an average of at least two epoxide groups per molecule; and, a curing agent; wherein the curable liquid component contains less than less than 0.5 wt % of monoepoxide molecules (based on the total weight of the aliphatic resin component); wherein the curable liquid component contains 1 to 90 wt % of polyepoxide molecules containing at least three epoxide groups per molecule (based on the total weight of the aliphatic resin component); and, wherein the curable liquid component is a liquid at 25° C. and atmospheric pressure; wherein the phosphor is dispersed in the curable liquid component. The present invention further relates to a lighting device.

Phosphor converted light emitting diode lighting devices use a phosphor (e.g., YAG) or mixture of phosphors to convert some or all of the light emitted by a blue or ultraviolet light emitting semiconductor diode light source (e.g., GaN chip) to provide, for example, white light. The conversion of the source luminescence spectrum produced by the GaN chip to longer wavelengths by a phosphor is commonly referred to as a down-conversion of the source emission. An unconverted portion of the source luminescent spectrum combines with the light of longer wavelength emitted by the phosphor to produce white light. Such devices are of increasing importance given their improved energy efficiency compared to more conventional lighting devices.

Phosphor converted light emitting diode lighting devices (pcLEDs) typically comprises an LED die light source that is encapsulated with an optically clear and thermally stable material. The encapsulating material generally serves at least one of three functions, namely (1) it facilitates incorporation of the light source into a device; (2) it provides protection for the fragile wiring for the light source; and (3) it behaves as a refractive intermediary between the high index die and low index air. In some pcLED devices, a preformed plastic lens or glass lens is affixed or bonded to a package in which the LED light source die is mounted. A curable liquid encapsulant material containing a phosphor is then injected into the cavity between the LED die and the plastic lens (or glass lens) and is subsequently cured to completely seal the LED die.

There is an increasing trend of directly molding a phosphor loaded curable liquid encapsulant material onto an LED die using an in-line molding process. In these in-line molding processes, a curable liquid encapsulant material loaded with a phosphor is injected or potted into a mold cavity containing a LED die (or into which an LED die is immersed) and then curing the encapsulant material, wherein the encapsulant material both encapsulates the LED die, encapsulates the phosphor, and forms a lens for shaping the light emitted from the LED die. Such in-line molding processes eliminate the prefabrication and assembly of a lens into the pcLED device. As a result, such in-line molding processes promise more cost effective high volume manufacturing of pcLED devices.

Accordingly, curable materials are of interest as lens, phosphor carriers and encapsulant materials for use in pcLED device applications. For example, in the manufacture of pcLED devices, manufacturers desire optical materials with high transparency in the visible region, high phosphor loading capacity, and excellent heat stability over tens of thousands of hours of operation. Additionally the pcLED device industry uses liquid transformative wavelength conversion mediums, which are then cured in place after much of the device has already been assembled. Therefore the curing polymer system must be curable under conditions which do not harm the assembled device.

Materials conventionally used to encapsulate LED dies include epoxy resins and silicones. Conventional epoxy resins tend to exhibit poor light stability (i.e., they yellow) over time following exposure to ultraviolet light or to elevated thermal conditions. This yellowing leads to an overall reduction in the light output and to an undesired spectrum modification in light output from the pcLED device over time. Conventional silicones exhibit better heat and light stability. As a result, silicones are becoming the dominant encapsulant for use in pcLED devices. Conventional silicone encapsulants; however, exhibit undesirable refractive indices ranging from 1.41 to 1.57 (measured at 550 nm). Moreover, it has proven difficult to achieve refractive indices of higher than about 1.6 (measured at 550 nm) in silicon systems without compromising other key performance properties such as flowability in the uncured state.

One group of curable liquids for use in LED devices is disclosed by Conner et al. in United States Patent Application Publication No. 2009/0039313. Conner et al. disclose a (thio) phenoxyphenyl phenyl silane composition comprising a (thio)phenoxyphenyl phenyl silane having formula I $$Ph^2\text{-}Q\text{-}Ph^1\text{-}Si(Ph^3)(OR)_2 \qquad (I)$$

wherein: $Ph^1$ is a phenyl ring having $Ph^2$-Q-, —$Si(Ph^3)(OR)_2$ and four hydrogen atoms as substituents; $Ph^2$-Q is a (thio) phenoxy group where $Ph^2$ is phenyl and Q is selected from oxygen atom, sulfur atom, and combinations thereof; $Ph^2$-Q is in a position on the $Ph^1$ phenyl ring which is ortho-, meta-, or para-relative to the Si atom; $Ph^3$ is phenyl; and R is independently selected from a hydrogen atom, a $C_{1-10}$ hydrocarbon radical, and combinations thereof; wherein the $C_{1-10}$ hydrocarbon radical is independently selected from: linear, branched, or cyclic $C_{1-10}$ alkyl; phenyl; substituted phenyl; arylalkyl; and combinations thereof.

Notwithstanding, there remains a need for curable transparent materials for use in the manufacture of lighting devices. In particular, there remains a need for curable liquid components having a low viscosity in the uncured state, good thermal stability, transparency and which are capable of incorporating a phosphor for use in pcLED lighting devices.

The present invention provides a transformative wavelength conversion medium, comprising: a phosphor; and, a curable liquid component, wherein the curable liquid component, comprises: an aliphatic resin component, wherein the aliphatic resin component has an average of at least two epoxide groups per molecule; and, a curing agent; wherein the curable liquid component contains less than 0.5 wt % of monoepoxide molecules (based on the total weight of the aliphatic resin component); wherein the curable liquid component contains 1 to 90 wt % of polyepoxide molecules containing at least three epoxide groups per molecule (based on the total weight of the aliphatic resin component); and, wherein the curable liquid component is a liquid at 25° C. and atmospheric pressure; wherein the phosphor is dispersed in the curable liquid component.

The present invention provides a transformative wavelength conversion medium, comprising: a phosphor; and, a curable liquid component, wherein the curable liquid component, comprises: an aliphatic resin component, wherein the aliphatic resin component has an average of at least two epoxide groups per molecule; and, a curing agent; wherein the curable liquid component contains less than 0.5 wt % of monoepoxide molecules (based on the total weight of the aliphatic resin component); wherein the curable liquid component contains 20 to 50 wt % of polyepoxide molecules containing at least three epoxide groups per molecule (based on the total weight of the aliphatic resin component); and, wherein the curable liquid component is a liquid at 25° C. and atmospheric pressure; wherein the phosphor is dispersed in the curable liquid component.

The present invention provides a transformative wavelength conversion medium, comprising: a phosphor; and, a curable liquid component, wherein the curable liquid component, comprises: an aliphatic resin component, wherein the aliphatic resin component has an average of at least two epoxide groups per molecule; and, a curing agent; wherein the curable liquid component contains less than 0.5 wt % of monoepoxide molecules (based on the total weight of the aliphatic resin component); wherein the curable liquid component contains 20 to 50 wt % of polyepoxide molecules containing at least three epoxide groups per molecule (based on the total weight of the aliphatic resin component); wherein the aliphatic resin component contains ≥50 wt % of alicyclic diepoxide molecules having at least one alicyclic skeleton per molecule; and, wherein the curable liquid component is a liquid at 25° C. and atmospheric pressure; wherein the phosphor is dispersed in the curable liquid component.

The present invention provides a transformative wavelength conversion medium, comprising: a phosphor; and, a curable liquid component, wherein the curable liquid component, comprises: an aliphatic resin component, wherein the aliphatic resin component has an average of at least two epoxide groups per molecule; and, a curing agent; wherein the curable liquid component contains less than 0.5 wt % of monoepoxide molecules (based on the total weight of the aliphatic resin component); wherein the curable liquid component contains 20 to 50 wt % of polyepoxide molecules containing at least three epoxide groups per molecule (based on the total weight of the aliphatic resin component); wherein the aliphatic resin component contains ≥50 wt % of alicyclic diepoxide molecules having at least one alicyclic skeleton per molecule; wherein the alicyclic diepoxide molecules having at least one alicyclic skeleton per molecule are selected from the group consisting of diglycidyl ethers of molecules according to formula (I)

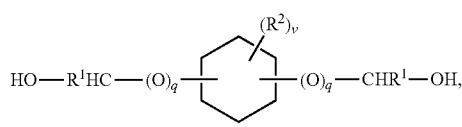

molecules according to formula (II)

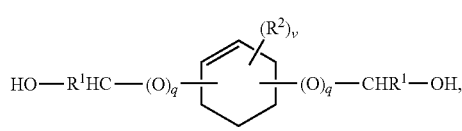

molecules according to formula (III)

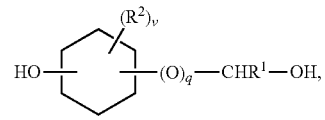

molecules according to formula (IV)

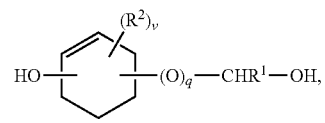

molecules according to formula (V)

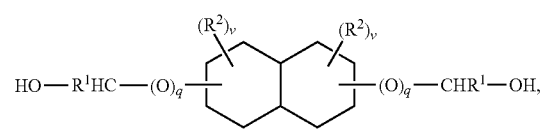

molecules according to formula (VI)

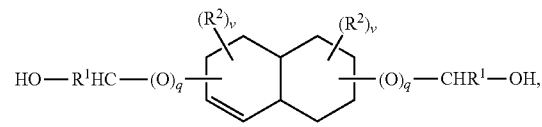

molecules according to formula (VII)

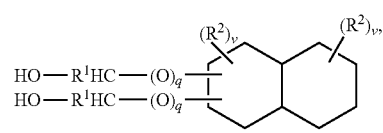

molecules according to formula (VIII)

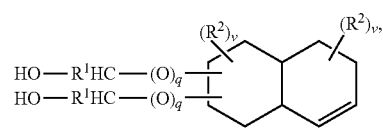

molecules according to formula (IX)

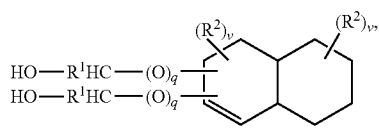

molecules according to formula (X)

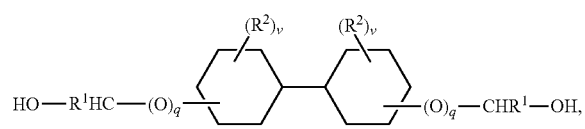

molecules according to formula (XI)

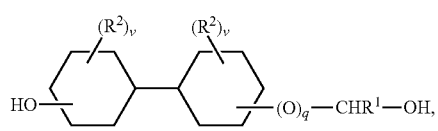

molecules according to formula (XII)

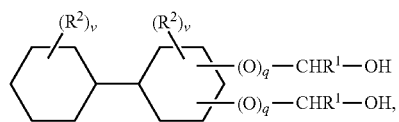

molecules according to formula (XIII)

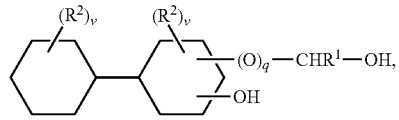

molecules according to formula (XIV)

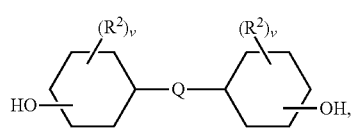

and, mixtures thereof; wherein each $R^1$ is independently selected from the group consisting of a H, a $C_{1-6}$ hydrocarbyl group and a $C_{1-6}$ hydrocarbylene group; wherein each $R^2$ is independently selected from the group consisting of a $C_{1-12}$ hydrocarbyl group, a $C_{1-12}$ alkoxy group and a $C_{1-12}$ oxo organyl group; wherein Q is a bridging group selected from the group consisting of $C_{1-12}$ alkylene group, an arylene group, an oxygen, a sulfur, an —O=S=O— group, an —S(O)— group, an —C(O)— group, an —($R^3$)N(C=O)— group; where $R^3$ is selected from the group consisting of a hydrogen, a $C_{1-6}$ alkyl group; wherein each q is independently selected from the group consisting of 0 and 1; and, wherein each v is independently selected from the group consisting of 0, 1 and 2; and, wherein the curable liquid component is a liquid at 25° C. and atmospheric pressure; wherein the phosphor is dispersed in the curable liquid component.

The present invention provides a transformative wavelength conversion medium, comprising: a phosphor; and, a curable liquid component, wherein the curable liquid component, comprises: an aliphatic resin component, wherein the aliphatic resin component has an average of at least two epoxide groups per molecule; and, a curing agent; wherein the curable liquid component contains less than 0.5 wt % of monoepoxide molecules (based on the total weight of the aliphatic resin component); wherein the curable liquid component contains 20 to 50 wt % of polyepoxide molecules containing at least three epoxide groups per molecule (based on the total weight of the aliphatic resin component); wherein the aliphatic resin component contains ≥50 wt % of alicyclic diepoxide molecules having at least one alicyclic skeleton per molecule; wherein the alicyclic diepoxide molecules are selected from the group consisting of diglycidyl ethers of molecules according to formula (I)

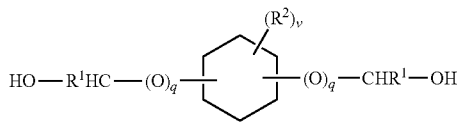

and mixtures thereof; wherein each $R^1$ is independently selected from the group consisting of a H, a $C_{1-6}$ hydrocarbyl group and a $C_{1-6}$ hydrocarbylene group; wherein each $R^2$ is independently selected from the group consisting of a $C_{1-12}$ hydrocarbyl group, a $C_{1-12}$ alkoxy group and a $C_{1-12}$ oxo organyl group; wherein each q is independently selected from the group consisting of 0 and 1; and, wherein each v is independently selected from the group consisting of 0, 1 and 2; wherein the polyepoxide molecules containing at least three epoxide groups per molecule are selected from the group consisting of triglycidyl ether containing molecules according to formula (A)

(A)

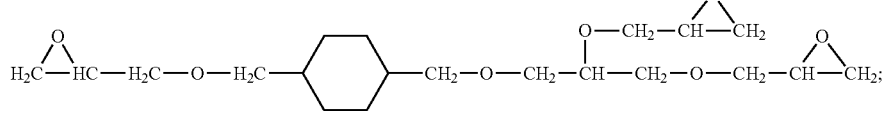

triglycidyl ether containing molecules according to formula
(B)

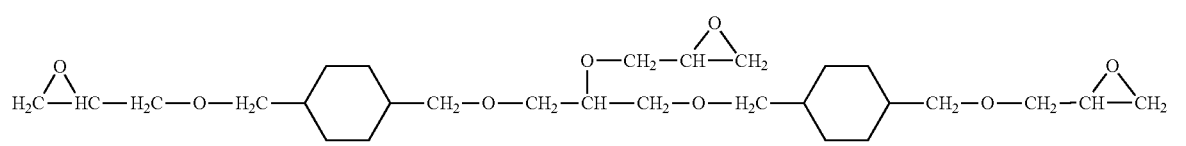

(B)

and mixtures thereof; and, wherein the curable liquid component is a liquid at 25° C. and atmospheric pressure; wherein the phosphor is dispersed in the curable liquid component.

The present invention provides a transformative wavelength conversion medium, comprising: a phosphor; and, a curable liquid component, wherein the curable liquid component, comprises: an aliphatic resin component, wherein the aliphatic resin component has an average of at least two epoxide groups per molecule; and, a curing agent; wherein the curable liquid component contains less than 0.5 wt % of monoepoxide molecules (based on the total weight of the aliphatic resin component); wherein the curable liquid component contains 20 to 50 wt % of polyepoxide molecules containing at least three epoxide groups per molecule (based on the total weight of the aliphatic resin component); wherein the aliphatic resin component contains ≥50 wt % of alicyclic diepoxide molecules having at least one alicyclic skeleton per molecule; wherein the alicyclic diepoxide molecules are selected from the group consisting of a diglycidyl ether of cis-1,3-cyclohexanedimethanol; a diglycidyl ether of trans-1,3-cyclohexanedimethanol; a diglycidyl ether of cis-1,4-cyclohexanedimethanol; a diglycidyl ether of trans-1,4-cyclohexanedimethanol; and, mixtures thereof: and, wherein the curing agent is selected from the group consisting of methylhexahydrophthalic anhydride; benzyl triethylammonium halides; and, mixtures thereof; and, wherein the curable liquid component is a liquid at 25° C. and atmospheric pressure; wherein the phosphor is dispersed in the curable liquid component.

The present invention provides a transformative wavelength conversion medium, comprising: a phosphor, and, a curable liquid component, wherein the curable liquid component, comprises: an aliphatic resin component, wherein the aliphatic resin component has an average of at least two epoxide groups per molecule; and, a curing agent; wherein the curable liquid component contains less than 0.5 wt % of monoepoxide molecules (based on the total weight of the aliphatic resin component); wherein the curable liquid component contains 1 to 90 wt % of polyepoxide molecules containing at least three epoxide groups per molecule (based on the total weight of the aliphatic resin component); wherein the curable liquid component is a liquid at 25° C. and atmospheric pressure; wherein the phosphor is dispersed in the curable liquid component; and, wherein the phosphor is selected from the group consisting of a quantum dot and a material having a formula $$M(II)_aM(I)_bM(III)_cD_dE_eC_fF_gH_h:A$$

wherein: $0<a<2$; $0\le b\le 0.6$; $0\le c\le 2$; $0<d\le 5$; $0\le e\le 8$; $0\le f\le 5$; $0\le g<2.5$; $0\le h<0.5$; M(II) is at least one divalent cation; M(I) is at least one monovalent cation; M(III) is at least one trivalent cation; A is a luminescence activator doped in the host crystal lattice; D is Si; E is selected from the group consisting of N, P, As, Sb and Bi; C is a tetravalent anion of carbon; F is at least one divalent anion selected from the group consisting of O, S, Se, and Te; and, H comprises at least one monovalent anion selected from the group consisting of F, Cl, Br, and I.

The present invention provides a transformative wavelength conversion medium, comprising: a phosphor; and, a curable liquid component, wherein the curable liquid component, comprises: an aliphatic resin component, wherein the aliphatic resin component has an average of at least two epoxide groups per molecule; a curing agent; and, an additive selected from the group consisting of a solvent, a cure accelerator, an antioxidant, a refractive index modifier (e.g., $TiO_2$), a nonreactive diluent, an epoxy resin diluent having at least two epoxide groups per molecule, a thickener, a reinforcing material, a filler, a pigment, a dye, a mold release agent, a wetting agent, a stabilizer, a thermal regulating agent, an optical dispersant, a surfactant, and mixtures thereof; wherein the curable liquid component contains less than 0.5 wt % of monoepoxide molecules (based on the total weight of the aliphatic resin component); wherein the curable liquid component contains 1 to 90 wt % of polyepoxide molecules containing at least three epoxide groups per molecule (based on the total weight of the aliphatic resin component): and, wherein the curable liquid component is a liquid at 25° C. and atmospheric pressure; wherein the phosphor is dispersed in the curable liquid component.

The present invention provides a lighting device, comprising: a light source, wherein the light source produces light having a source luminescence spectrum; a phosphor; and, a cured curable liquid component, wherein the curable liquid component, comprises, as initial components: an aliphatic resin component, wherein the aliphatic resin component has an average of at least two epoxide groups per molecule; and, a curing agent; wherein the curable liquid component contains less than 0.5 wt % of monoepoxide molecules (based on the total weight of the aliphatic resin component); wherein the curable liquid component contains 1 to 90 wt % of polyepoxide molecules containing at least three epoxide groups per molecule (based on the total weight of the aliphatic resin component); and, wherein the curable liquid component is a liquid at 25° C. and atmospheric pressure; and, wherein the phosphor is radiationally coupled to the light source.

The present invention provides a lighting device, comprising: a light source, wherein the light source produces light having a source luminescence spectrum; and, an active layer, wherein the active layer comprises a transformative wavelength conversion medium of the present invention in a cured state; wherein the phosphor is radiationally coupled to the light source.

DETAILED DESCRIPTION

The transformative wavelength conversion medium of the present invention include a phosphor dispersed in a curable liquid component, wherein the curable liquid component is capable of undergoing a curing reaction upon exposure to at least one of thermal energy and photonic energy, wherein the curable liquid component transforms upon curing from a liquid to a cured solid via an addition reaction (i.e., essentially no off gassing and no fugitive curing byproducts produced). The curable liquid component used in the transformative wavelength conversion medium of the present invention particularly lends itself for use in the phosphor converted light emitting diode (pcLED) devices. In many pcLED devices, special requirements are presented given that a partially or completely closed space must be filled with the transformative wavelength conversion medium. In such applications, the transformative wavelength conversion medium, wherein the curable liquid component is in an uncured (liquid) state is dispensed or injected into the mold cavity and is then cured. In such molding processes, it is desirable to minimize the content of volatiles in the transformative wavelength conversion medium used to avoid the need to facilitate off gassing; removal of a solvent; or, removal of fugitive curing byproducts from the system. In such molding processes, it is also desirable for the transformative wavelength conversion medium used to exhibit a very low viscosity to facilitate rapid wet out, degassing and mold filling.

The term "light source" used herein and in the appended claims means any source of light capable of exciting or irradiating a phosphor directly or indirectly (i.e., the light source can either excite or irradiate the phosphor directly, or excite another substance which then provides the excitation or irradiation energy to the phosphor.

The term "phosphite ester" used herein and in the appended claims means a chemical compound having the general formula $P(OR)_3$, wherein R is selected from a second bond to the P (i.e., wherein the oxygen atom has two bonds to the P) and a carbon containing moiety. Examples of phosphite esters include 9,10-dihydro-9-oxa-10-phosphaphenanthrene-10-oxide; bis(2,6-di-t-butyl-4-methylphenyl)pentaerythritol diphosphite; bis(2,4-di-t-butylphenyl)pentaerythritol diphosphite; tris(2,4-di-t-butylphenyl)phosphite; tris(monononylphenyl)phosphite; tris(dinonylphenyl)phosphite; tris(2-ethylhexyl)phosphite; triphenyl phosphite; tris(monononylphenyl)phosphite; and, trisisodecyl phosphite.

The transformative wavelength conversion medium of the present invention, preferably comprises: a phosphor; and, a curable liquid component, wherein the curable liquid component, comprises: an aliphatic resin component, wherein the aliphatic resin component has an average of at least two epoxide groups per molecule; and, a curing agent (preferably, wherein the curing agent is selected from the group consisting of catalytic curing agents, co-reactive curing agents and mixtures thereof); wherein the curable liquid component contains less than 1 wt % (preferably, ≤0.5 wt %; more preferably, ≤0.3 wt %; still more preferably, ≤0.09 wt %; yet still more preferably, ≤0.01 wt %; most preferably, <the lower detectable limit) of monoepoxide molecules (based on the total weight of the aliphatic resin component); wherein the curable liquid component contains 1 to 90 wt % (preferably, 15 to 55 wt %; more preferably, 20 to 50 wt %; most preferably, 30 to 50 wt %) of polyepoxide molecules containing at least three epoxide groups per molecule (based on the total weight of the aliphatic resin component); and, wherein the curable liquid component is a liquid at 25° C. and atmospheric pressure; wherein the phosphor is dispersed in the curable liquid component.

The phosphor used in the transformative wavelength conversion medium of the present invention is preferably selected from substances that exhibit the phenomenon of luminescence (i.e., the emission of light by a substance not resulting from heat). Preferably, the phosphor used absorbs light having a given source luminescence spectrum and reemits light having a different luminescence spectrum. More preferably, the phosphor used in the transformative wavelength conversion medium is selected from the group consisting of a quantum dot and an oxycarbonitride phosphor.

The quantum dots used in the transformative wavelength conversion medium of the present invention preferably are selected from nanocrystals of a semiconductor material, wherein the nanocrystals have excitons that are confined in all three spatial dimensions. Preferably, the semiconductor materials are selected from the group including Group II-VI semiconductors (e.g., ZnS, ZnSe, ZnTe, CdS, CdSe, CdTe, HgS, HgSe, HgTe); Group III-V semiconductors (e.g., GaN, GaP, GaAs, GaSb, InN, InP, InAs, InSb, AlAs, AlP, AlSb); Group IV semiconductors (e.g., Ge, Si, Pb); and, combinations thereof.

The oxycarbonitride phosphors used in the transformative wavelength conversion medium of the present invention are preferably are selected from materials having a formula

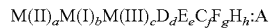

$M(II)_aM(I)_bM(III)_cD_dE_eC_fF_gH_h$:A wherein 0<a<2; 0≤b≤0.6; 0≤c<2; 0<d≤5; 0<e≤8; 0<f≤5; 0≤g<2.5; and 0≤h<0.5; wherein M(II) is at least one divalent cation (preferably, selected from the group consisting of at least one of Ca, Sr and Ba); wherein M(I) is at least one monovalent cation (preferably, selected from the group consisting of at least one of Li, Na and K); wherein M(III) is at least one trivalent cation (preferably, selected from the group consisting of at least one of Al, Ga and B); wherein A is a luminescence activator doped in the host crystal lattice (preferably, selected from the group consisting of at least one of $Eu^{2+}$, $Ce^{3+}$, $Tb^{3+}$, $Yb^{2+}$ and $Mn^{2+}$; more preferably, $Eu^{2+}$); wherein D is Si; wherein E is selected from the group consisting of N, P, As, Sb and Bi (preferably, N); wherein C is a tetravalent anion of carbon; wherein F is at least one divalent anion selected from the group consisting of O, S, Se, and Te (preferably, O); wherein H comprises at least one monovalent anion selected from the group consisting of F, Cl, Br, and I (preferably F).

Preferably, the curable liquid component used in the transformative wavelength conversion medium of the present invention contains less than 1 wt % (preferably, ≤0.5 wt %; more preferably, ≤0.3 wt %; still more preferably, ≤0.09 wt %; yet still more preferably, ≤0.01 wt %; most preferably, <the lower detectable limit) of monoepoxide molecules (based on the total weight of the aliphatic resin component); and, 1 to 90 wt % (preferably 15 to 55 wt %; more preferably 20 to 50 wt %; most preferably 30 to 50 wt %) of polyepoxide molecules containing at least three epoxide groups per molecule (based on the total weight of the aliphatic resin component). More preferably, the curable liquid component used in the transformative wavelength conversion medium of the present invention contains ≤0.09 wt % of monoepoxide molecules (based on the total weight of the aliphatic resin component); and, 30 to 50 wt % of polyepoxide molecules containing at least three epoxide groups per molecule (based on the total weight of the aliphatic resin component).

Preferably, the curable liquid component used in the transformative wavelength conversion medium of the present invention contains <0.001 wt % (more preferably, <0.00001 wt %; most preferably, <the lower detectable limit) of silica. Preferably, the aliphatic resin component used in the transformative wavelength conversion medium of the present invention contains <0.001 wt % (more preferably, <0.00001 wt %; most preferably, <the lower detectable limit) of phosphite ester. Preferably, the transformative wavelength conversion medium of the present invention contains <0.001 wt % (more preferably, <0.00001 wt %; most preferably, <the lower detectable limit) of silica. Preferably, the aliphatic resin component used in the transformative wavelength conversion medium of the present invention contains <0.001 wt % (more preferably, <0.00001 wt %; most preferably, <the lower detectable limit) of phosphite ester.

Preferably, the curable liquid component used in the transformative wavelength conversion medium of the present invention when in a cured state is transparent to light in the visible spectrum. More preferably, the curable liquid component used in the transformative wavelength conversion medium of the present invention when in a cured state exhibits a % total transmittance, % $T_T$, at 450 nm of ≥90% (measured under the conditions set forth in the Examples).

Preferably, the curable liquid component used in the transformative wavelength conversion medium of the present invention when in a cured state is non-yellowing. More preferably, the curable liquid component used in the transformative wavelength conversion medium of the present invention when in a cured state exhibits a yellowness index (YI) of ≤20 (still more preferably, ≤10; most preferably, ≤5) (measured under the conditions set forth in the Examples). Most preferably, the curable liquid component used in the transformative wavelength conversion medium when in a cured state exhibits thermal non-yellowing stability. The term "thermal non-yellowing stability" used herein and in the appended claims means that the curable liquid component following exposure to thermal energy when in a cured state by placing in a convection oven set at 125° C. for a period of 7 days exhibits a yellowness index (YI) of ≤20 (still more preferably, ≤10; most preferably, ≤5) (measured under the conditions set forth in the Examples). Optionally, the aliphatic resin component used in the curable liquid component can be treated to remove any undesirable color that may be present. For example, a decolorizing agent can, optionally, (1) be dispersed in the aliphatic resin component; and then, (2) be removed from the aliphatic resin component by filtration. Decolorizing agents can include, for example, an activated carbon (e.g., powder or pellet form); clays, ion exchange resins, and sodium borohydride.

The aliphatic resin component used in the transformative wavelength conversion medium of the present invention has an average of at least two epoxide groups per molecule. Preferably, the aliphatic resin component used in the transformative wavelength conversion medium of the present invention has an average of two primary carbon atom containing epoxide groups per molecule.

Preferably, the aliphatic resin component used in the transformative wavelength conversion medium of the present invention contains 10 to 90 wt % of alicyclic diepoxide molecules having at least one alicyclic skeleton per molecule.

More preferably, the aliphatic resin component used in the transformative wavelength conversion medium of the present invention contains ≥45 wt % of alicyclic diepoxide molecules having at least one alicyclic skeleton per molecule. Most preferably, the aliphatic resin component used in the transformative wavelength conversion medium of the present invention contains ≥50 wt % of alicyclic diepoxide molecules having at least one alicyclic skeleton per molecule.

Alicyclic diepoxide molecules having at least one alicyclic skeleton per molecule used in the transformative wavelength conversion medium of the present invention are preferably selected from the group consisting of diglycidyl ethers of molecules according to formula (I)

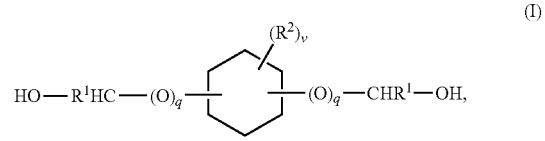

molecules according to formula (II)

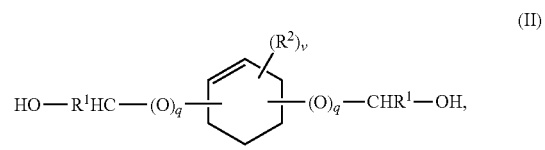

molecules according to formula (III)

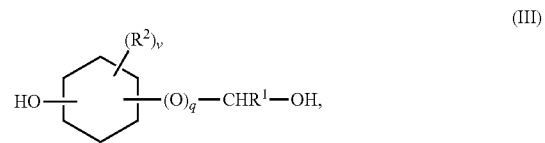

molecules according to formula (IV)

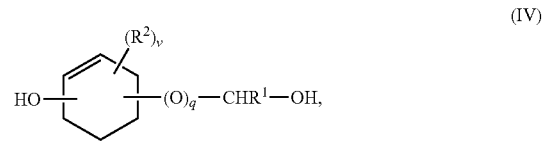

molecules according to formula (V)

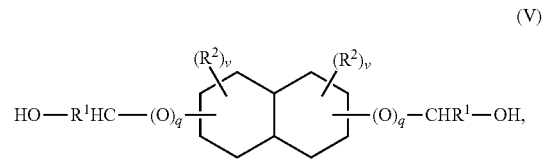

molecules according to formula (VI)

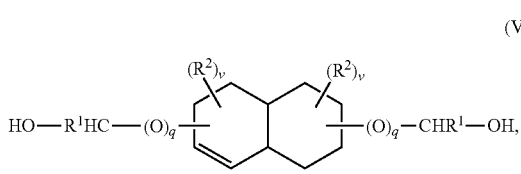

molecules according to formula (VII)

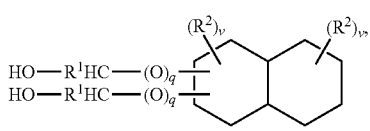

molecules according to formula (VIII)

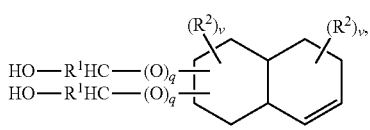

molecules according to formula (IX)

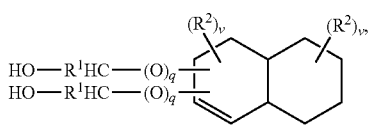

molecules according to formula (X)

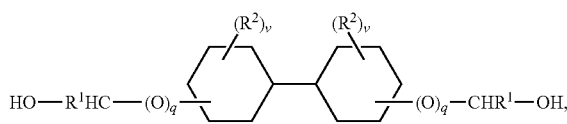

molecules according to formula (XI)

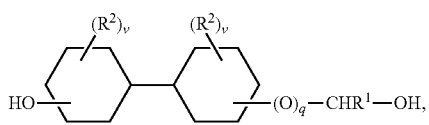

molecules according to formula (XII)

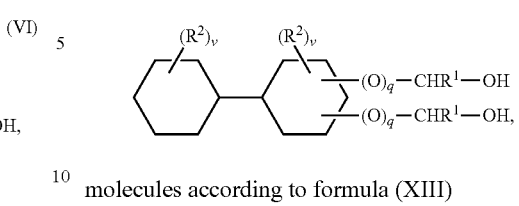

molecules according to formula (XIII)

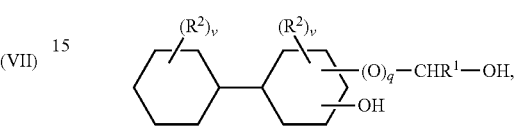

molecules according to formula (XIV)

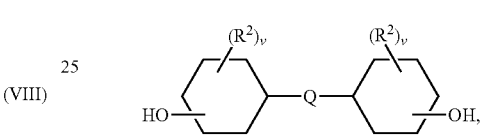

and, mixtures thereof, wherein each $R^1$ is independently selected from the group consisting of a H, a $C_{1-6}$ hydrocarbyl group and a $C_{1-6}$ hydrocarbylene group (preferably, a $C_{1-6}$ hydrocarbylene group); wherein each $R^2$ is independently selected from the group consisting of a $C_{1-12}$ hydrocarbyl group, a $C_{1-12}$ alkoxy group and a $C_{1-12}$ oxo organyl group (preferably, a $C_{1-12}$ alkyl group, $C_{1-12}$ alkoxy group, a $C_{3-12}$ cycloalkyl group and a $C_{3-12}$ cycloalkoxy group); wherein Q is a bridging group selected from the group consisting of $C_{1-12}$ alkylene group (saturated divalent aliphatic hydrocarbon radical), an arylene group, an oxygen, a sulfur, an —O=S=O— group; an —S(O)— group, an —C(O)— group, an —($R^3$)N(C=O)— group (where $R^3$ is selected from the group consisting of a hydrogen, a $C_{1-6}$ alkyl group); wherein each q is independently selected from the group consisting of 0 and 1; and, wherein each v is independently selected from the group consisting of 0, 1 and 2. More preferably, alicyclic diepoxide molecules having at least one alicyclic skeleton per molecule used in the transformative wavelength conversion medium of the present invention are selected from the group consisting of dilycidyl ethers of molecules according to formula (I)

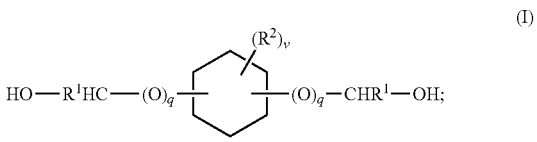

and, mixtures thereof. Most preferably, alicyclic diepoxide molecules having at least one alicyclic skeleton per molecule used in the transformative wavelength conversion medium of the present invention are selected from the group consisting of a diglycidyl ether of cis-1,3-cyclohexanedimethanol; a diglycidyl ether of trans-1,3-cyclohexanedimethanol; a diglycidyl ether of cis-1,4-cyclohexanedimethanol; a diglycidyl ether of trans-1,4-cyclohexanedimethanol; and, mixtures thereof.

Polyepoxide molecules containing at least three epoxide groups per molecule used in the transformative wavelength conversion medium of the present invention are preferably oligomers. More preferably, the polyepoxide molecules containing at least three epoxide groups per molecule used in the transformative wavelength conversion medium of the present invention are preferably oligomers having at least one alicyclic skeleton per molecule. Most preferably, the polyepoxide molecules containing at least three epoxide groups per molecule used in the transformative wavelength conversion medium of the present invention are preferably oligomers selected from the group consisting of triglycidyl ether containing molecules according to formula (A)

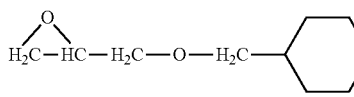
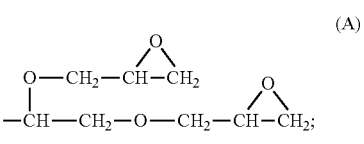

(A)

triglycidyl ether containing molecules according to formula (B)

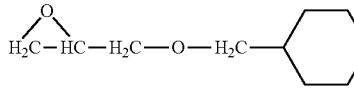
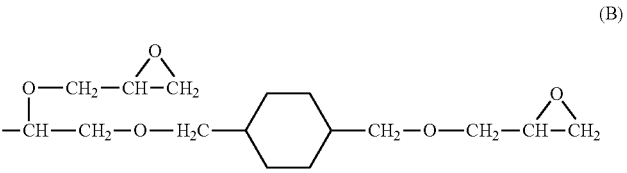

(B)

and mixtures thereof.

Preferably, the aliphatic resin component used in the transformative wavelength conversion medium of the present invention when in an uncured state exhibits a viscosity of ≤100 millipascal second (mPa·s) at 25° C. (measured under the conditions set forth in the Examples). More preferably, the curable liquid component used in the transformative wavelength conversion medium of the present invention when in an uncured state exhibits a viscosity of 14.5 to 30 millipascal second (mPa·s) at 25° C. (measured under the conditions set forth in the Examples).

The curing agent used in the curable liquid component of the present invention is not particularly limiting. One of ordinary skill in the art will be able to select an appropriate curing agent for use in the curable liquid component of the present invention. Preferably, the curing agent is selected from the group consisting of catalytic curing agents, co-reactive curing agents, and mixtures thereof. Co-reactive curing agents (also referred to as hardeners or cross-linking agents) include, for example, anhydrides, carboxylic acids, amine compounds, phenols, mercaptans, and mixtures thereof. Particular co-reactive curing agents include, for example, polyamines, polyamides, polyaminoamides, dicyandiamides, polycarboxylic acids, polycarboxylic anhydrides, diaminodiphenylsulfone, styrene-maleic acid anhydride (SMA) copolymers and mixtures thereof. A preferred co-reactive curing agent is an anhydride (more preferably, carboxylic acid anhydrides; most preferably, an anhydride selected from the group consisting of methylhexahydrophthalic anhydride; nadic methyl anhydride; and, mixtures thereof). Catalytic curing agents include, for example, tertiary amines (including imidazoles), quaternary ammonium salts (e.g., quaternary ammonium halides), Lewis acids (e.g., boron trifluoride), Lewis acid-amine complexes, and mixtures thereof. Preferred catalytic curing agents include benzyl trialkylammonium halides (more preferably, benzyl triethylammonium chloride). Preferably, the curing agent is selected from the group consisting of methylhexahydrophthalic anhydride; nadic methyl anhydride; benzyl trialkylammonium halides; and, mixtures thereof. More preferably, the curing agent is selected from the group consisting of methylhexahydrophthalic anhydride; benzyl trialkylammonium halides; and, mixtures thereof. Most preferably, the curing agent is selected from the group consisting of methylhexahydrophthalic anhydride; benzyl triethylammonium chloride; and, mixtures thereof.

The transformative wavelength conversion medium of the present invention optionally further comprises an additive selected from the group consisting of a solvent, a cure accelerator, an antioxidant, a refractive index modifier (e.g., $TiO_2$), a nonreactive diluent, an epoxy resin diluent having at least two epoxide groups per molecule, a thickener, a reinforcing material, a filler, a pigment, a dye, a mold release agent, a wetting agent, a stabilizer, a thermal regulating agent, an optical dispersant (e.g., light scattering particles), a surfactant and mixtures thereof.

Optical dispersant optionally used in the transformative wavelength conversion medium of the present invention include light scattering particles. Preferably, the light scattering particles are dispersed in or around the curable liquid component, wherein the curable liquid component is either in an uncured or cured state. Preferred light scattering particles include yttrium oxide ($Y_2O_3$); barium sulfate ($BaSO_4$); zinc oxide (ZnO); alumina ($Al_2O_3$); niobium oxide ($Nb_2O_5$); tantalum oxide (TaOs); silicon nitride ($Si_3N_4$); aluminum nitride; glass beads; diamond; zirconium dioxide ($ZrO_2$); silicon carbide (SiC) and boron nitride (BN).

Preferably, the transformative wavelength conversion medium of the present invention comprises 0.01 to 50 wt % of phosphor. More preferably, the transformative wavelength conversion medium of the present invention comprises 0.01 to 5 wt % of phosphor.

Preferably, the phosphor is combined with the curable liquid component by a blending or mixing process using equipment and techniques well known to one of ordinary skill in the art.

Preferably, the lighting devices of the present invention, comprise: a light source, wherein the light source produces light having a source luminescence spectrum; a phosphor; and, a cured curable liquid component, wherein the curable liquid component, comprises, as initial components: an aliphatic resin component, wherein the aliphatic resin component has an average of at least two epoxide groups per molecule; and, a curing agent (preferably, wherein the curing agent is selected from the group consisting of catalytic curing agents, co-reactive curing agents and mixtures thereof); wherein the curable liquid component contains less than 1 wt % (preferably, ≤0.5 wt %; more preferably, ≤0.3 wt %; still more preferably, ≤0.09 wt %; yet still more preferably, ≤0.01 wt %; most preferably, <the lower detectable limit) of monoepoxide molecules (based on the total weight of the aliphatic resin component); wherein the curable liquid component contains 1 to 90 wt % (preferably 15 to 55 wt %; more preferably 20 to 50 wt %; most preferably 30 to 50 wt %) of polyepoxide molecules containing at least three epoxide groups per molecule (based on the total weight of the aliphatic resin component); and, wherein the curable liquid component is a liquid at 25° C. and atmospheric pressure; and, wherein the phosphor is radiationally coupled to the light source.

Preferably, the light source used in the lighting device of the present invention is a semiconductor light source. Preferably, the semiconductor light source is based on a Group III-V or Group II-VI quantum well structure. Specifically, the semiconductor light source is preferably based on structures comprising compounds that combine elements of the periodic table of the chemical elements from Group III with those from Group V or elements from Group II with those from Group VI.

Preferably, the lighting device of the present invention emits light. More preferably, the lighting device of the present invention emits light selected from the group consisting of white light, red light, green light, blue light, yellow light and magenta light.

Preferably, the phosphor is dispersed within the curable liquid component forming a transformative wavelength conversion medium used to produce an active layer in the lighting devices of the present invention upon curing of the curable liquid component. Preferably, the active layer is disposed directly or indirectly over a light emitting surface of the light source. Preferably, the active layer is disposed directly over a light emitting surface of the light source. Preferably, the active layer is disposed indirectly over a light emitting surface of the light source. Preferably, the active layer is provided with at least one featured surface to enhance the light emitted from the light device. For example, a surface of the active layer furthest from the light emitting surface of the light source can be structured to provide collimated light from the lighting device (e.g., for auto headlamp applications) or diffuse light from the lighting device (e.g., for solid state lighting applications) depending on the ultimate application for the lighting device.

Preferably, the lighting device of the present invention comprises a light emitting diode manufacturing assembly, comprising: a support structure having a plurality of individual semiconductor light emitting diode die light sources; and, a mold having a plurality of cavities corresponding with the plurality of individual semiconductor light emitting diode die light sources; wherein the plurality of cavities is filled with a transformative wavelength conversion medium of the present invention; and wherein the support structure and the mold are oriented such that the plurality of individual semiconductor light emitting diode die light sources are each at least partially immersed in the transformative wavelength conversion medium contained in the plurality of cavities. Preferably, each of the cavities in the plurality of cavities is in the shape of a lens. Preferably, the curable liquid component in the transformative wavelength conversion medium is heat curable (more preferably, wherein the curable liquid component is cured upon heating at 100 to 200° C. for 10 to 200 minutes). Preferably, the transformative wavelength conversion medium when cured encapsulates the individual semiconductor light emitting diode dies: functions as a lens; and, converts the source luminescence spectrum of the light source to the emitted spectrum of the lighting device, wherein the source luminescence spectrum and the emitted spectrum are different. The mold optionally further comprises a plurality of feed channels that facilitate injection of the transformative wavelength conversion medium in a liquid state into the plurality of cavities.

The light emitting diode manufacturing assembly of the present invention facilitates the manufacture of lighting devices comprising designed manifolds containing multiple individual semiconductor light emitting dies for use in, for example, automobile headlight assemblies. The light emitting diode manufacturing assembly of the present invention also facilitates the manufacture of individual semiconductor light emitting diode light source lighting devices. That is, upon curing of the curable liquid component in the transformative wavelength conversion medium, the mold can be separated from the assembly and the plurality of individual semiconductor light emitting diode die light sources encapsulated with the transformative wavelength conversion medium on the substrate can be diced into multiple individual lighting devices.

Some embodiments of the present invention will now be described in detail in the following Examples.

Example 1

Master Batch of Catalyst/Curing Agent Mixture

The catalyst/curing agent mixture used in each of Comparative Examples C2-C3 and Examples 3-4 was prepared by loading a 50 mL vial containing a magnetic stirring bar with 1.73 g of benzyltriethylammonium chloride ("BTEAC") catalyst (available from Sigma-Aldrich Co. LLC) and 39.32 g of methylhexahydrophthalic anhydride ("MHHPA") curing agent (available from Dixie Chemical Company) in a glove box with a nitrogen atmosphere. The vial and its contents were then placed on a thermostatically controlled hotplate set at 65° C. in the glove box under a nitrogen atmosphere with magnetic stirring provided to the vial contents. The vial and its contents were then removed from the heat source and allowed to cool to room temperature in the glove box.

Comparative Example C1

Preparation of Aliphatic Resin

An aliphatic resin was prepared by the epoxidation reaction of 1,4-cyclohexanedimethanol (99%, mixture of cis and trans; product #125598 available from Sigma-Aldrich Co. LLC)("CHDM") with epichlorohydrin by addition of sodium hydroxide in the presence of catalytic BTEAC. The product aliphatic resin was then analyzed to contain 11.18 wt % monoglycidyl ethers of CHDM (CHDM MGE); 54.38 wt % diglycidyl ethers of CHDM (CHDM DGE) by external weight calibrated gas chromatographic (GC) analysis using a Hewlett Packard 5890 Series II Gas Chromatograph outfitted with a 60 m×0.248 mm×0.25 µm film thickness J&W GC column using a DB-1 stationary phase. The flame ionization detector was operated at 300° C. The injector temperature was maintained at 300° C. Helium carrier gas flow through the column was maintained at 1.1 mL per min. For the analysis, an initial 50° C. oven temperature with heating at 12° C. per min to a final temperature of 300° C. was used. Area % GC analysis was used to detect the components of the product aliphatic resin which were not detected through the externally weight calibrated GC analysis method. The area % GC analysis included 0.015 area % toluene; 1.004 area % di(2,3-epoxy propyl)ether; 0.17 area % minor components with retention times between CHDM MGE and CHDM DGE. Considering the area % values as equivalent to wt %, the product aliphatic resin contained 31.94 wt % oligomers, which oligomers comprises those components with retention times greater than the CHDM DGE. The epoxide equivalent weight (EEW) of the product aliphatic resin was 158.54.

Example 2

Preparation of Aliphatic Resin Component

A sample (750.72 g) of the product aliphatic resin prepared according to Comparative Example C1 was subjected to a partial fractional vacuum distillation. Distillation cuts were taken sequentially to selectively remove all residual light components with boiling point temperatures below that of CHDM DGE, including the unreacted CHDM and the bulk of the CHDM-MGE. Ten distillations cuts removed 214.92 g of residual light components from the product aliphatic resin component remaining in the distillation pot. The product aliphatic resin component in the distillation pot was then analyzed to contain 0.30 wt % CHDM-MGE and 49.43 wt % CHDM-DGE by external weight calibrated GC analysis using the method given in Comparative Example C1. Area % GC analysis was used to detect the components of the product aliphatic resin which were not detected through the externally weight calibrated GC analysis method. The area % GC analysis included 0.07 area % minor components with retention times between CHDM and CHDM MGE and 0.79 area % minor components with retention times between CHDM MGE and CHDM DGE. Considering the area % values as equivalent to wt %, the CHDM epoxy resin contained 49.41 wt % oligomers, which oligomers comprises those components with retention times greater than the CHDM-DGE. The epoxide equivalent weight (EEW) of the product aliphatic resin was 164.39.

Comparative Example C2

Cured Curable Liquid Component

A portion (3.39 g) of the product aliphatic resin component prepared according to Comparative Example C1 was weighed into a glass vial containing a magnetic stirring bar. The glass vial was then placed in a glove box under a nitrogen atmosphere. A portion (3.61 g) of the catalyst/curing agent mixture prepared according to Example 1 was then added to the glass vial. The glass vial was then sealed and the contents of the vial were stirred for 30 minutes to give a homogeneous curable liquid component. The sealed glass vial was then removed from the glove box and degassed in a vacuum desiccator for 20 minutes until bubbling of the solution ceased. The degassed curable liquid component was then poured into a 2 inch×2 inch cavity of a polytetrafluoroethylene mold in an oven under nitrogen. The mold and its contents were then placed into a convection oven under nitrogen. The curable liquid component in the mold was then cured under dynamic nitrogen by heating in the oven using the temperature profile shown in TABLE 1. The cured casting was them removed from the oven and allowed to cool to room temperature. The cured casting was visibly yellow in color.

TABLE 1

| Time (min) | Temperature (° C.)[1] |
|---|---|
| 30 | 80 |
| 30 | 90 |
| 30 | 100 |
| 30 | 120 |
| 30 | 140 |
| 30 | 160 |

[1]temperature set point for the convection oven

Example 3

Cured Curable Liquid Component

A portion (3.69 g) of the product aliphatic resin component prepared according to Example 2 was weighed into a glass vial containing a magnetic stirring bar. The glass vial was then placed in a glove box under a nitrogen atmosphere. A portion (3.78 g) of the catalyst/curing agent mixture prepared according to Example 1 was then added to the glass vial. The glass vial was then sealed and the contents of the vial were stirred for 30 minutes to give a homogeneous curable liquid component. The sealed glass vial was then removed from the glove box and degassed in a vacuum desiccator for 20 minutes until bubbling of the solution ceased. The degassed curable liquid component was then poured into a 2 inch×2 inch cavity of a polytetrafluoroethylene mold in an oven under nitrogen. The mold and its contents were then placed into a convection oven under nitrogen. The curable liquid component in the mold was then cured under dynamic nitrogen by heating in the oven using the temperature profile shown in TABLE 1. The cured casting was them removed from the oven and allowed to cool to room temperature. The cured casting was transparent and colorless.

Yellowness Index of Cured Films

The cured films prepared according to Comparative Example C2 and Example 3 were analyzed for yellowness index (YI). The yellowness index of each of the cured films and a standard white tile were measured using a ColorQuest XE dual beam spectrophotometer (Column YI E313-98) according to ASTM E313-10. The results are provided in TABLE 2.

TABLE 2

| Ex. # | X | Y | Z | YI |
|---|---|---|---|---|
| C2 | 65.03 | 70.18 | 57.22 | 26.84 |
| 3 | 70.29 | 74.91 | 75.13 | 6.79 |
| Standard | 79.19 | 84.17 | 90.33 | −0.97 |

Example 4

Preparation of Aliphatic Resin Component

An aliphatic resin was prepared using the method of Example 2. The product aliphatic resin component was analyzed to contain 0.19 wt % CHDM MGE and 52.64 wt % CHDM DGE by external weight calibrated GC analysis using the method given in Comparative Example C1. Area % GC analysis was used to detect the components of the product aliphatic resin which were not detected through the externally weight calibrated GC analysis method. The area % GC analysis included 0.03 area % minor components with retention times between CHDM and CHDM MGE and 0.52 area % minor components with retention times between CHDM MGE and CHDM DGE, 0.24 area % CHDM MGE, and 66.37 area % CHDM DGE. Considering the area % values as equivalent to wt %, the CHDM epoxy resin contained 32.84 wt % oligomers, which oligomers comprises those components with retention times greater than the CHDM DGE. The EEW of the product aliphatic resin was 162.39.

Example 5

Cured Curable Liquid Component

A portion (3.66 g) of the product aliphatic resin component prepared according to Example 4 was weighed into a glass vial containing a magnetic stirring bar. The glass vial was then placed in a glove box under a nitrogen atmosphere. A portion (3.79 g) of the catalyst/curing agent mixture prepared according to Example 1 was then added to the glass vial. The glass vial was then sealed and the contents of the vial were stirred for 30 minutes to give a homogeneous curable liquid component. The sealed glass vial was then removed from the glove box and degassed in a vacuum desiccator for 20 minutes until bubbling of the solution ceased. The degassed curable liquid component was then poured into a 2 inch×2 inch cavity of a polytetrafluoroethylene mold in an oven under nitrogen. The mold and its contents were then placed into a convection oven under nitrogen. The curable liquid component in the mold was then cured under dynamic nitrogen by heating in the oven using the temperature profile shown in TABLE 1. The cured casting was them removed from the oven and allowed to cool to room temperature. The cured casting was transparent and pale yellow colored.

Yellowness Index of Cured Film

The cured film prepared according to Example 5 was analyzed for YI as previously described. The results are provided in TABLE 3.

TABLE 3

| Ex. # | X | Y | Z | YI |
| --- | --- | --- | --- | --- |
| 5 | 68.68 | 73.53 | 70.04 | 11.29 |
| Standard | 79.19 | 84.17 | 90.36 | −1.23 |

Differential Scanning Calorimetry of Cured Films

Portions of the cured films prepared according to Comparative Example C2 and Example 5 were analyzed by differential scanning calorimety using a DSC 2910 Modulated DSC (TA Instruments) instrument. A heating rate of 7° C. per min from 0° C. to 200° C. was used under a stream of nitrogen flowing at 35 cubic centimeters per minute. Each respective cured sample for analysis of Tg was cut from the original casting and then contained in an open aluminum pan. A second scan of each sample was repeated under the aforementioned conditions. The average results for the duplicate scans are provided in TABLE 4.

TABLE 4

| Ex. # | $T_g$ (° C.) |
| --- | --- |
| C2 | 73.3 |
| 5 | 88.8 |

Example 6

Preparation Cured Transformative Wavelength Conversion Medium

A portion (3.66 grams) the aliphatic resin component prepared according to Example 1 was weighed into a 50 mL vial. An A630 red europium strontium carbide nitride silicide phosphor available from Lightscape Materials, Inc. (having a formula $M(II)_a M(I)_b M(III)_c D_d E_e C_f F_g H_h$:A) was then mixed with the aliphatic resin component at 1 wt % loading (0.037 gram). The glass vial was then placed in a glove box under a nitrogen atmosphere and a portion (3.79 g) of the catalyst/curing agent mixture prepared according to Example 1 was added to the 50 mL vial with stirring for 30 minutes to form a transformative wavelength conversion medium. The transformative wavelength conversion medium in the sealed glass vial was then removed from the glove box and degassed in a vacuum desiccator for 20 minutes until bubbling of the solution ceased. The degassed transformative wavelength conversion medium was then poured into a separate 2 inch by 2 inch by 1 mm deep poly(tetrafluoroethylene) mold under a nitrogen atmosphere and cured under dynamic nitrogen into a film by placing the film in a convection oven and using the temperature profile shown in TABLE 1. The cured film was then analyzed for photoluminescence yield. The photoluminescence yield was measured using QuantaMaster 40 spectrophotometer (Photon Technologies International Birmingham, N.J.). The results are reported in TABLE 5 along with photoluminescence yield data for the phosphor material alone.

TABLE 5

| Ex. # | Photoluminescence yield (%) |
| --- | --- |
| 6 | 72 |

We claim:

1. A transformative wavelength conversion medium, comprising:
   a phosphor dispersed in a curable liquid component;
   wherein the curable liquid component comprises a curing agent and an aliphatic resin component;
   wherein the aliphatic resin component has an average of at least two epoxide groups per molecule and contains at least 50 wt % of alicyclic diepoxide molecules having at least one alicyclic skeleton per molecule, 20 to 50 wt % of polyepoxide molecules containing at least three epoxide groups per molecule, and less than 0.5 wt % of monoepoxide molecules, all based on the total weight of the aliphatic resin component;
   wherein the alicyclic diepoxide molecules are selected from the group consisting of diglycidyl ethers of molecules according to formula (I)

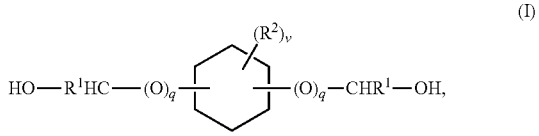

and mixtures thereof; wherein each $R^1$ is independently selected from the group consisting of a H, a $C_{1-6}$ hydrocarbyl group and a $C_{1-6}$ hydrocarbylene group; wherein each $R^2$ is independently selected from the group consisting of a $C_{1-12}$ hydrocarbyl group, a $C_{1-12}$ alkoxy group and a $C_{1-12}$ oxo organyl group; wherein each q is independently selected from the group consisting of 0 and 1; and, wherein each v is independently selected from the group consisting of 0, 1 and 2;

wherein the polyepoxide molecules are selected from the group consisting of triglycidyl ether containing molecules according to formula (A)

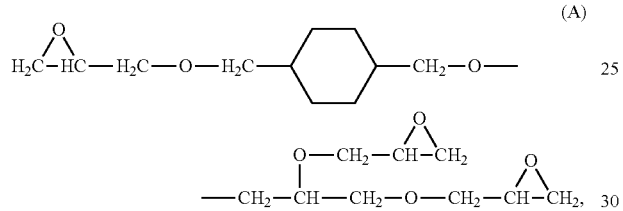

triglycidyl ether containing molecules according to formula (B)

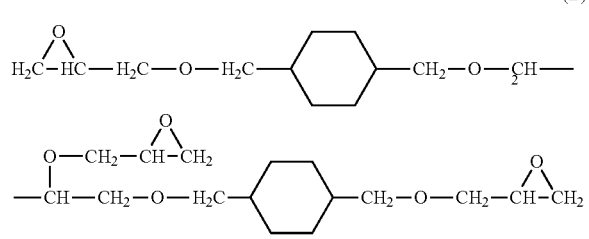

and mixtures thereof; and wherein the curable liquid component is a liquid at 25° C. and atmospheric pressure; and the curable liquid component exhibits a yellowness index of less than or equal to 20 when in a cured state.

2. The transformative wavelength conversion medium of claim 1, wherein the alicyclic diepoxide molecules are selected from the group consisting of a diglycidyl ether of cis-1,3-cyclohexanedimethanol; a diglycidyl ether of trans-1,3-cyclohexanedimethanol; a diglycidyl ether of cis-1,4-cyclohexanedimethanol; a diglycidyl ether of trans-1,4-cyclohexanedimethanol; and mixtures thereof; and wherein the curing agent is selected from the group consisting of methylhexahydrophthalic anhydride; benzyl triethylammonium halides; and mixtures thereof.

3. The transformative wavelength conversion medium of claim 1, wherein the phosphor is selected from the group consisting of a quantum dot and a material having a formula

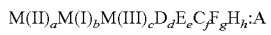

wherein
 $0<a<2$;
 $0\le b\le 0.6$;
 $0\le c<2$;
 $0<d\le 5$;
 $0<e\le 8$;
 $0<f\le 5$;
 $0\le g<2.5$;
 $0\le h<0.5$;
 M(II) is at least one divalent cation;
 M(I) is at least one monovalent cation;
 M(III) is at least one trivalent cation;
 A is a luminescence activator doped in the host crystal lattice;
 D is Si;
 E is selected from the group consisting of N, P, As, Sb and Bi;
 C is a tetravalent anion of carbon;
 F is at least one divalent anion selected from the group consisting of O, S, Se, and Te; and,
 H comprises at least one monovalent anion selected from the group consisting of F, Cl, Br, and I.

4. The transformative wavelength conversion medium of claim 1, further comprising an additive selected from the group consisting of a solvent, a cure accelerator, an antioxidant, a refractive index modifier, a nonreactive diluent, an epoxy resin diluent having at least two epoxide groups per molecule, a thickener, a reinforcing material, a filler, a pigment, a dye, a mold release agent, a wetting agent, a stabilizer, a thermal regulating agent, an optical dispersant, a surfactant, and mixtures thereof.

5. A lighting device, comprising:
 a light source, wherein the light source produces light having a source luminescence spectrum; and
 an active layer, wherein the active layer comprises the transformative wavelength conversion medium of claim 1 in a cured state;
 wherein the phosphor is radiationally coupled to the light source.

* * * * *